United States Patent [19]

Chin et al.

[11] 4,429,415
[45] Jan. 31, 1984

[54] SIGNAL-SEEKING TUNING SYSTEM WITH SIGNAL LOSS PROTECTION FOR A TELEVISION RECEIVER

[75] Inventors: Danny Chin, Plainsboro; John G. N. Henderson, Princeton; Robert J. Maturo, Bricktown, all of N.J.

[73] Assignee: RCA Corporation, New York, N.Y.

[21] Appl. No.: 326,171

[22] Filed: Nov. 30, 1981

[51] Int. Cl.$^3$ .......................... H04B 1/26; H03J 7/22; H03J 7/28

[52] U.S. Cl. .................................. 455/164; 358/193.1; 358/195.1; 455/192

[58] Field of Search ............... 455/164, 182, 192, 200; 358/193.1, 195.1

[56] References Cited

U.S. PATENT DOCUMENTS

| | | | |
|---|---|---|---|
| 3,936,753 | 2/1976 | Clark | 455/164 |
| 3,949,158 | 4/1976 | Rzeszewski et al. | 455/192 |
| 3,988,681 | 10/1976 | Schürmann | 455/161 |
| 4,004,231 | 1/1977 | Elshuber et al. | 455/192 |
| 4,009,439 | 2/1977 | Rast | 455/180 |
| 4,041,535 | 8/1977 | Rzeszewski et al. | 358/191 |
| 4,123,716 | 10/1978 | Borg | 455/164 |
| 4,127,821 | 11/1978 | Okada et al. | 455/192 |
| 4,161,708 | 7/1979 | Friberg et al. | 334/15 |
| 4,207,531 | 6/1980 | Ito | 455/164 |
| 4,217,552 | 8/1980 | Mogi et al. | 455/164 |
| 4,220,973 | 9/1980 | Macchetta | 358/193.1 |
| 4,236,182 | 11/1980 | Minoura et al. | 358/193.1 |
| 4,254,506 | 3/1981 | Henderson et al. | 455/158 |
| 4,300,165 | 11/1981 | Kim | 358/195.1 |
| 4,302,778 | 11/1981 | Tanaka | 455/164 |

FOREIGN PATENT DOCUMENTS 55-118216 9/1980 Japan ............................ 455/164

OTHER PUBLICATIONS

Caironi, Giancarlo, "EPM: A New Tuning System Based on a Single Chip Including Non-Volatile Memory", IEEE Transactions on Consumer Electronics, vol. CE-25, Aug. 1979, pp. 606-620.
Sony KV-4000 Schematic Diagram.

Primary Examiner—Marc E. Bookbinder
Attorney, Agent, or Firm—E. M. Whitacre; P. J. Rasmussen; C. A. Berard, Jr.

[57] ABSTRACT

A signal-seeking tuning system for a television receiver scans the VHF and UHF signal bands until a present TV channel signal is detected. Tuning voltage is developed by a digital-to-analog converter in response to a binary word stored in an up-down counter. The value of the binary word increases when a scan-up signal is applied and decreases when a scan-down signal is applied. Scanning is stopped by inhibiting changing of the binary word when a valid sequence of AFT signals is detected.

Thereafter, the tuning voltage is compensated for drifts by incrementing or decrementing the binary word whenever the AFT signal departs from a predetermined condition. This correction is inhibited, however, when the RF carrier signal is lost so that the desired tuning is not also lost, whereby the selected channel is still tuned when the RF carrier signal reappears.

10 Claims, 7 Drawing Figures

SIGNAL-SEEKING TUNING SYSTEM WITH SIGNAL LOSS PROTECTION FOR A TELEVISION RECEIVER

The present invention relates to tuning systems for television receivers and, in particular, to those of the signal-seeking type.

Signal-seeking type tuning systems for television (TV) receivers are relatively simple and therefore do not generally provide the customer features associated with more complex tuning systems including a frequency synthesizer, a controller and often a memory. However, signal-seeking tuning systems are far less expensive than frequency synthesis tuning systems. Basic signal-seeking tuning systems often include only a simple automatic fine tuning (AFT) control and do not include automatic band changing between VHF and UHF TV frequency bands, or provision for remaining tuned to a selected channel during signal interruption (such as can occur from transmission outages or from adjusting a "rabbit-ear" antenna). In addition, known signal-seeking tuning systems can require an inconveniently long time (20-30 seconds) to scan the entire range of channels in the VHF and UHF TV bands.

The tuning system described herein which incorporates the present invention in various ones of its aspects overcomes these disadvantages while maintaining relative simplicity and avoiding the need for a memory so as to be useful in lower-cost TV receivers.

Accordingly, the apparatus of the present invention scans a plurality of radio frequency (RF) signal bands for selecting present ones of RF signals. The tuning system comprises a tuner for selecting ones of the RF signals responsive to a tuning signal, and a signal processor for developing a control signal to fine tune the IF signal. A digital counter develops a binary word which changes in value when a scan signal is selectively applied to the counter and a converter develops the tuning signal in response to the binary word. Changing the binary word is stopped when the IF signal has a predetermined condition. Thereafter, a correction device increments or decrements the binary word, when the control signal departs a predetermined range of values in first or second directions, respectively, to tune the IF signal. The correction device is inhibited from changing the binary word when a detected RF signal is subsequently removed.

Figure 1:
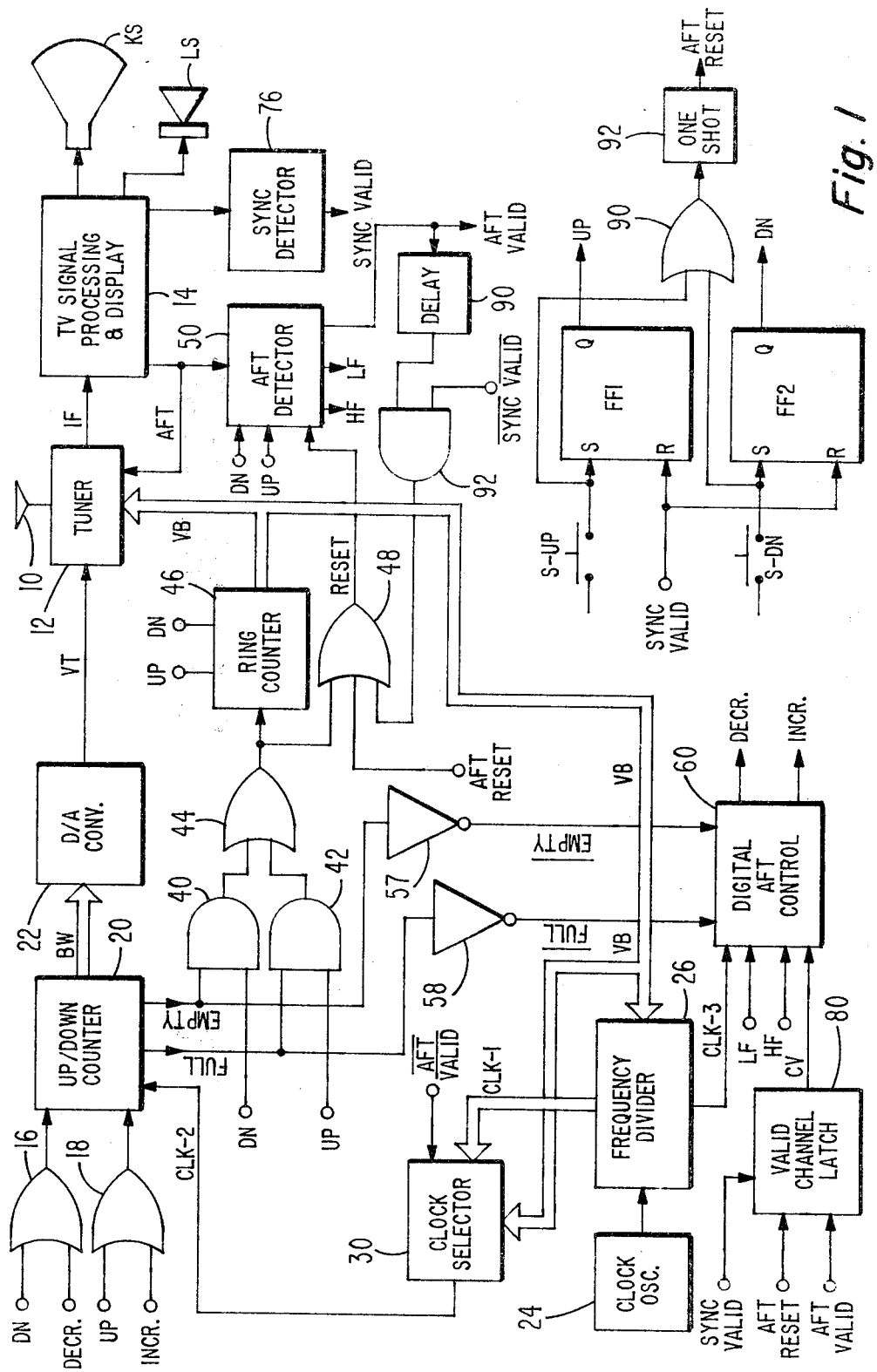
FIG. 1 is a diagram of a TV receiver including the present invention.

In the TV receiver of FIG. 1, tuner 12 is controlled by analog tuning voltage VT and digital bandswitch voltages VB for heterodyning RF signals received from antenna 10 corresponding to television channels to develop an IF signal. The IF signal is coupled from tuner 12 to TV signal processing and display device 14 for developing a picture on kinescope KS and audio reproduction through loudspeaker LS. Departures of the frequency of the picture carrier of the IF signal from a nominal IF frequency (e.g., 45.75 MHz in the United States) are detected by signal processor 14 to develop an automatic fine tuning (AFT) signal which is applied to the local oscillator to maintain the IF signal at the predetermined frequency. The TV receiver thus far described is conventional.

Signal-seeking in the direction of increasing channel number, i.e., increasing RF signal frequency, is accomplished by the closure of scan-up switch S-UP to set flip-flop FF1 which produces digital signal UP at its output Q. Similarly, scanning in the direction of decreasing channel number is initiated by the closure of scan-down switch S-DN to set flip-flop FF2 which produces digital signal DN. Signals from S-UP and S-DN are coupled to one-shot 92 through OR gate 90 to develop a digital AFT RESET pulse signal of predetermined duration, the use of which will be explained later.

Digital up/down counter 20 develops an eleven-bit binary word BW which can be decreased in value when signal DN is applied via OR gate 16 and which can be increased in value when signal UP is applied via OR gate 18. The value of BW increases and decreases, however, only when digital clock signal CLK-2 is applied. Binary word BW is applied to digital-to-analog converter 22 wherein it is converted to the analog tuning voltage VT and applied to tuner 12. Tuning voltage VT ranges between about 1 and 25 volts in each TV reception band, i.e., the lower-VHF-TV band (channels 2-6), the upper-VHF-TV band (channels 7-13) and the UHF-TV band (channels 14-83). Converter 22 is scaled so that the full range of values of BW corresponds to the range of voltages required for VT.

Signal CLK-2 is developed when the user activates either of scan controls S-UP or S-DN as follows. Signal AFT RESET from one-shot 92 is applied to AFT detector 50 via OR gate 48 thereby causing digital signal AFT VALID to become a logical LOW signal. The inversion of AFT VALID ($\overline{\text{AFT VALID}}$) is applied to cause clock selector 30 to develop signal CLK-2 from digital signal CLK-1 which is always present from frequency divider 26. Clock selector 30 will be described in detail below. Once the foregoing sequence initiates the increasing or decreasing of binary word BW, VT will correspondingly increase or decrease until one of two conditions occurs: (1) no valid TV channel is present and binary word BW reaches a maximum or minimum value, or (2) a valid TV channel signal is found.

Counter 20 is cyclical and "rolls over" when counting up past the maximum value of BW or down past the minimum value of BW. That is, when counter 20 reaches the maximum value of binary word BW (e.g., all ones) the next pulse of clock signal CLK-2 will cause BW to change to its minimum value (e.g., all zeros) and thereafter to continue counting up towards its maximum value in response to CLK-2. Similarly, when counting down past the minimum value (all zeros), counter 20 rolls over to the maximum value (all ones) and continues counting down in response to CLK-2.

Digital Bandswitch signals VB are developed, for example, by ring counter 46, which has a number of stages equal to the number of different frequency bands to be distinguished. Three stages are satisfactory to cover the VHF and UHF TV bands in the United States. When the maximum value of BW is reached, counter 20 develops digital signal FULL (e.g., by means of an AND gate to detect coincidence of all ones). AND gate 42 detects the coincidence of the UP and FULL signals to generate a HIGH logic signal which passes via OR gate 44 to cause ring counter 46 to change from its present condition to the next condition in sequence. Ring counter 46 produces LOW-VHF, HI-VHF, UHF bandswitching signals in sequence when the UP signal is applied. Thus, in the upward scanning direction, binary word BW changes from the lower limit toward the upper limit, and when the upper limit is reached, the next higher bandswitching signal is generated and thereafter binary word BW again changes from the lower limit toward the upper limit.

Conversely, digital signal EMPTY is developed by counter 20 when binary word BW is of minimum value. The coincidence of signal EMPTY and signal DN at the inputs to AND gate 40 is coupled via OR gate 44 to cause ring counter 46 to sequence. Ring counter 46 produces UHF, HI-VHF, LO-VHF bandswitching signals in sequence when the DN signal is applied. Thus, in the downward scanning direction, binary word BW changes from the upper limit toward the lower limit and when the lower limit is reached, the next lower bandswitching signal is generated and thereafter binary word BW again changes from the upper limit toward the lower limit.

The foregoing scanning continues until a valid TV channel is found, or if no such channel is found, the cycling continues.

Scanning is stopped upon detection of the valid TV channel signal as follows. While the following description will consider the case for scanning up in frequency (with signal UP present), it is understood that a similar sequence obtains when scanning down in frequency. As the tuning approaches a present TV channel signal, the AFT signal developed by signal processor 14 will follow the characteristic shown in FIG. 4. As the center frequency $F_O$ is approached from below, voltage V-AFT will increase to the point where it exceeds the positive threshold level V-LF, thereby causing AFT detector 50 to generate digital signal LF during the time when the threshold V-LF is exceeded. As the tuned frequency continues to be increased, voltage V-AFT will decrease as the tuned frequency passes IF frequency $F_O$. V-AFT crosses frequency axis F and becomes more negative until threshold level V-HF is reached. When V-AFT becomes even more negative so that threshold V-HF is exceeded, AFT detector 50 develops digital signal HF. The sequential generation of signals LF and HF indicates that an RF carrier is present; this sequence combined with the presence of signal UP causes AFT detector 50 to generate digital signal AFT VALID. Development of signal AFT VALID causes clock selector 30 to remove signal CLK-2 from up/down counter 20, thereby stopping the changing of BW to terminate the signal-seeking scan of tuner 12.

If the carrier signal detected is in fact a valid TV channel, signal processor 14 of FIG. 1 will develop synchronization pulses. Sync detector 76 develops digital signal SYNC VALID in response to the average value of the synchronization pulses exceeding a threshold value. SYNC VALID is applied to reset both flip-flops FF1 and FF2 but will, in fact, only reset the one of them which was set by the activated one of scan controls S-UP and S-DN. This removes signal UP or signal DN so that the scanning operation itself terminates. Normal operation of the AFT loop in signal processor 14 thereafter tends to keep the receiver properly tuned to the presently selected RF carrier which is translated to IF center frequency $F_O$.

In the tuning system thus far described, scanning ends at an appropriate AFT condition as determined by AFT detector 50. Scanning is automatically reinitiated by developing the equivalent of an AFT RESET pulse if signal SYNC VALID is not developed within a predetermined time after signal AFT VALID is developed. To this end, delay device 90 is activated by signal AFT VALID. If valid sync is not detected by detector 76 within a predetermined time, $\overline{\text{SYNC VALID}}$ remains HIGH enabling AND gate 92 to pass the output developed by delay device 90 via OR gate 48 to AFT detector 50. Detector 50 is thereby reset and scanning is resumed. If a valid TV channel signal is tuned, $\overline{\text{SYNC VALID}}$ becomes LOW, thereby disabling AND gate 92 so that scanning remains terminated in spite of the operation of delay device 90. The predetermined delay of device 90 is selected to allow sufficient settling time before the synchronization signal is evaluated, e.g. 128 milliseconds.

As a practical matter, however, drifts can and will be introduced by temperature variations, component value changes, or frequency drifts of the transmitter or receiver. To compensate for such drifts beyond the range of correction afforded by the analog AFT voltage V-AFT generated by signal processor 14, digital AFT control 60 is employed to extend the range of AFT correction far beyond that obtainable from signal processor 14, which is typically limited to accommodating frequency differences of 1-2 megahertz. If the frequency drift is such that the IF frequency becomes lower than $F_O$, V-AFT tends to depart from the center voltage, e.g., zero volts, at $F_O$ along the characteristic of FIG. 4 until the threshold V-LF is reached which causes AFT detector 50 to develop digital signal LF. In response to clock signal CLK-3 developed by frequency divider 26 and signal LF, digital AFT control 60 generates an incrementing pulse signal INCR which is applied to counter 20 via OR gate 18 to increase the value of binary word BW by one count. As a result, VT, and the frequency to which tuner 12 is tuned, is increased to tune closer to IF center frequency $F_O$. Several increments may be needed to make voltage V-AFT become less than threshold level V-LF.

Similarly, if the frequency departs from $F_O$ in an increasing direction, V-AFT will increase negatively until threshold V-HF is exceeded causing AFT detector 50 to develop signal HF. In response to signal CLK-3 and signal HF together, digital AFT control 60 develops a decrementing pulse signal DECR which is applied via OR gate 16 to counter 20 to decrease the value of binary word BW by one count. As a result, VT decreases to cause tuner 12 to more closely tune frequency $F_O$.

Near the band boundaries, digital AFT control 60 may wrongly cause the next bandswitch voltage to be generated because of the "roll over" operation of counter 20 previously described. To avoid this, signal FULL from counter 20 is inverted by inverter 58 and applied as signal $\overline{\text{FULL}}$ to digital AFT control 60 to inhibit the development of signal INCR when BW is at maximum value. Similarly, signal EMPTY is inverted by inverter 57 and applied to control 60 as signal $\overline{\text{EMPTY}}$ to inhibit the development of signal DECR when BW is at its minimum value. Thus, undesired roll over of counter 20 in either direction is avoided once a valid TV signal is selected.

A valid channel latch 80 provides an additional advantageous feature. Latch 80 develops digital channel valid signal CV when an RF carrier is detected as indicated by the presence of signal AFT VALID, thereby enabling digital AFT control 60 previously described.

Presence of a valid RF carrier signal as indicated by signal SYNC VALID causes latch 80 to store an indication that a valid TV channel has, in fact, been tuned. Thereafter, should the valid RF carrier be lost (such as from a condition of outage at the transmitting station, a loose antenna connection, or a misadjustment of a rabbit-ear antenna), SYNC VALID is removed causing latch 80 to remove signal CV inhibiting the operation of digital AFT control 60. When the RF carrier reappears, signal SYNC VALID is again present and latch 80 restores signal CV to re-enable control 60. Thus, digital AFT control 60 controls the tuner to optimize tuning until a loss of RF carrier occurs at which occurrence the count of binary word BW in counter 20 is fixed until the RF carrier returns. In this manner, the tuning system is fixed in the optimum condition for receiving the selected RF carrier when it returns. In addition, annoying resumption of scanning in an attempt to tune the missing RF carrier during the time when it is absent is avoided. Latch 80 is reset by signal AFT RESET upon viewer initiation of scanning so to not develop signal CV. Thus digital AFT control 60 is inhibited during the search for a valid TV channel signal.

Further advantage results when clock signal CLK-2 has a frequency which changes according to the TV band being scanned. To that end, clock oscillator 24 drives frequency divider 26 which develops a plurality of digital clock signals indicated by the broad arrow CLK-1. Clock selector 30 selects the appropriate one of the clock signals included in CLK-1 in accordance with the bandswitch signals VB. Thus, a faster scanning rate is provided in the VHF bands where a greater change in tuning voltage VT is required to change tuning from one channel to an adjacent channel than in the UHF band.

The tuning system of FIG. 1 is comparably simple and requires no memory. As a result, it is relatively inexpensive, especially when embodied in substantial part in an integrated circuit, and well suited to a basic tuning system for a low-cost TV receiver.

Figure 2:
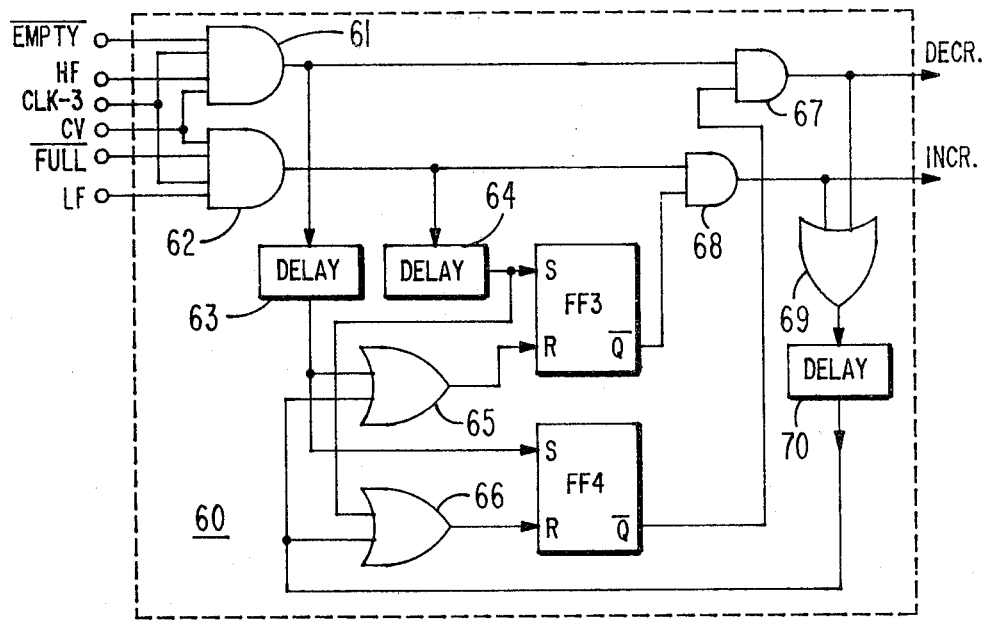
FIGS. 2, 3, 5, 6 and 7 are schematic diagrams of exemplary circuits employable in the tuning system shown in FIG. 1.

Exemplary embodiments of circuits useful in the receiver of FIG. 1 will now be described. Exemplary digital AFT control 60, shown in FIG. 2, includes two 4-input AND gates 61 and 62, each of which receives digital signal CV and clock signal CLK-3, e.g., 500 Hertz. Because flip-flops FF3 and FF4 are initially reset, their respective outputs $\overline{Q}$ are HIGH to respectively enable one input of each of AND gates 68 and 67.

AND gate 61 produces an output when a valid channel signal is received (CV is HIGH), the IF frequency is high (signal HF is HIGH because threshold V-HF is exceeded), binary word BW is not at its minimum value (signal $\overline{\text{EMPTY}}$ is HIGH), and a HIGH half-cycle of CLK-3 is present. With the aforedescribed inputs, the output from AND gate 61 is HIGH, thereby causing AND gate 67 to develop decrementing pulse signal DECR. AND gate 61 also initiates delay device 63 which sets flip-flop FF4 after a 4-microsecond delay to thereby remove coincidence at AND gate 67 to terminate signal DECR, and, via OR gate 65 to insure that FF3 is reset.

Signal DECR is coupled through OR gate 69 to activate delay device 70. The output pulse of device 70 is delayed for 32 milliseconds and is coupled via OR gates 65 and 66 to respectively reset a set one of flip-flops FF3 and FF4 after the 32-millisecond time delay has elapsed.

Similarly, when the IF frequency is too low so that V-AFT exceeds threshold V-LF, signal LF is developed and, so long as CV is HIGH and $\overline{\text{FULL}}$ is HIGH (BW is not at maximum value), AND gate 62 detects coincidence on the HIGH half-cycle of CLK-3 which creates coincidence at AND gate 68 to develop incrementing pulse signal INCR. Thereafter, delay device 64 sets flip-flop FF3 after a 4 microseconds delay thereby removing coincidence from AND gate 68 terminating pulse INCR. OR gate 69 and delay device 70 are activated as previously described.

As a result of the above-described arrangement of digital AFT control 60, alternating incrementing and decrementing pulses are generated rapidly, whereas successive incrementing or decrementing pulses are delayed by the 32-millisecond delay of device 70. Thus, successive changes of binary word BW in one direction at a rate faster than that to which converter 22 can respond are avoided. I.e., the 32-millisecond delay time of device 70 is selected compatibly with the time constant of a low pass filter for VT included in converter 22.

Figure 3:
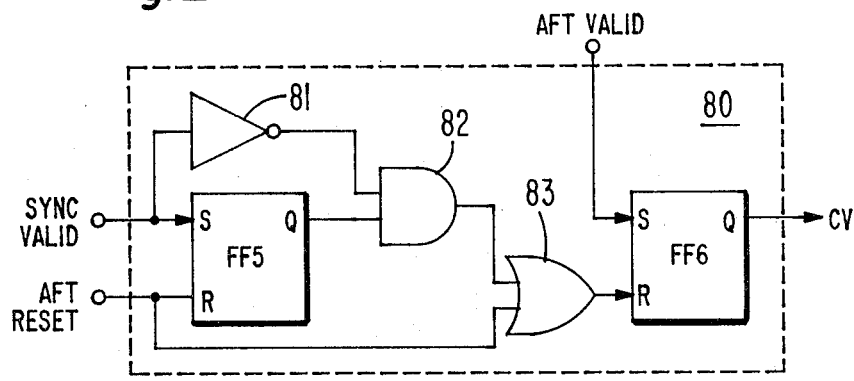

In exemplary valid channel latch 80, shown in FIG. 3, signal AFT VALID sets flip-flop FF6 to develop channel valid signal CV at its output Q, thereby enabling digital AFT control 60 just described above. When valid sync is present, signal SYNC VALID from detector 76 is applied to set flip-flop FF5. So long as sync remains valid, SYNC VALID is HIGH and is inverted by inverter 81, coincidence does not occur at AND gate 82 and signal CV remains HIGH. When sync is not valid, however, SYNC VALID is removed and is inverted by inverter 81 to produce coincidence with the HIGH Q output of FF5 at AND gate 82. As a result, a HIGH signal is coupled via OR gate 83, to reset flip-flop FF6 to remove signal CV which thereby inhibits the operation of digital AFT control 60. When signal SYNC VALID returns and signal AFT VALID is still HIGH, signal CV is again generated. Both flip-flop FF5 and FF6 are reset in response to signal AFT RESET becoming HIGH when scanning is initiated by the viewer.

Figure 4:
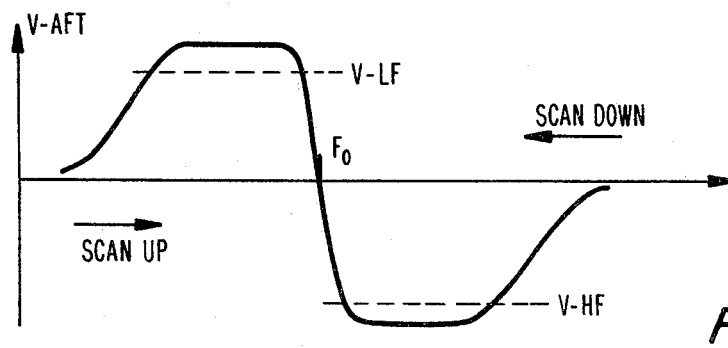
FIG. 4 is a graphical representation of an automatic fine tuning signal useful in understanding the tuning system shown in FIG. 1.
Figure 5:
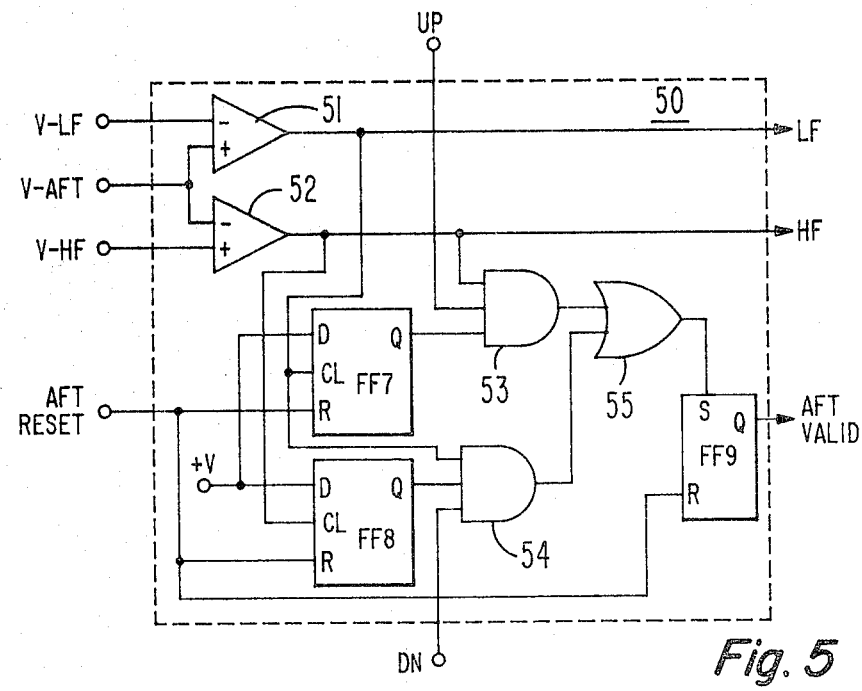

Exemplary AFT detector 50, shown in FIG. 5, includes voltage comparator 51 receiving positive threshold voltage V-LF at its inverting input point and voltage comparator 52 receiving negative threshold voltage V-HF at its non-inverting input point. AFT correction voltage V-AFT is applied to the other inputs of comparators 51 and 52 so that digital signal LF is developed (i.e. is HIGH) when V-AFT is more positive than V-LF and so that digital signal HF is developed (i.e., is HIGH) when V-AFT is more negative than V-HF. Flip-flops FF7 and FF8 are reset by signal AFT RESET at the viewer initiation of scanning and have their D-inputs connected to a logically high level +V. Signal AFT RESET developed by one shot 92 is of duration sufficient to permit scanning to proceed past the V-LH and V-HF "humps" shown in FIG. 4 before the AFT reset pulse is terminated. Two milliseconds has been found satisfactory.

When scanning up, the positive hump of the V-AFT characteristic, shown in FIG. 4, is first detected. In response, signal LF is applied to clock input CL of FF7 to cause its output Q to become HIGH. When the negative hump of the characteristics of FIG. 4 is detected, signal HF becomes HIGH creating coincidence with signal UP at the input to AND gate 53, the output of which passes via OR gate 55 to set flip-flop FF9 causing digital signal AFT VALID to become HIGH. In similar fashion when scanning down, the sequential development of signals HF then LF and the coincidence thereof with signal DN cause FF8, AND gate 54, OR gate 55 and FF9 to similarly produce a HIGH signal AFT VALID.

Figure 6:
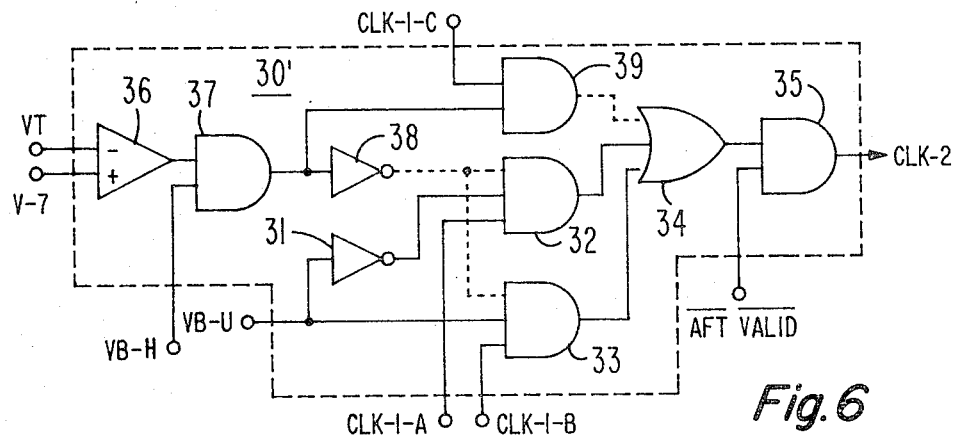

Exemplary clock selector 30', shown in FIG. 6, selects from among the plurality of clock signals CLK-1-A, CLK-1-B and CLK-1-C included in CLK-1 developed at various stages of frequency divider 26 to develop signal CLK-2 when AFT is not valid (i.e., when scanning). Clock selection is achieved as follows (ignoring for the moment inverter 38 and AND gate 39, the outputs of which are respectively assumed to be HIGH and LOW). When the TV receiver is operating in either the lower VHF or upper VHF bands, bandswitch signal VB-U for the UHF band is LOW thereby inhibiting AND gate 33 and, after inversion by inverter 31, enabling AND gate 32. Clock signal CLK-1-A of about 2 kilohertz is applied to AND gate 32 and is passed via OR gate 34 to AND gate 35. When tuning in the UHF band, band signal VB-U is high, thereby enabling AND gate 33 to pass 1 kilohertz clock signal CLK-1-B via OR gate 34 to AND gate 35, and disabling AND gate 32. Before AFT becomes valid (during scanning), the present one of CLK-1-A and CLK-1-B is passed by AND gate 35 to serve as signal CLK-2. The circuit just described causes binary word BW developed by counter 20 to be increased or decreased at twice the rate when tuning in the VHF band as compared to tuning in the UHF band. The difference in clock rates is provided to compensate for the different tuning voltage changes necessary to tune between adjacent channels in the different bands. This feature desirably decreases the total time required to scan all channels to less than 4 seconds (if no channel signals are present).

Clock selector 30' includes circuitry to further reduce the total scanning time to about 3.7 seconds as follows. The lowest channel in the upper VHF band (channel 7) ordinarily requires a much greater tuning voltage than do the lowest channels in the lower VHF and UHF TV bands. Therefore, it is advantageous that the range of tuning voltage below that required to tune VHF channel 7 be scanned through very rapidly since no valid TV channels can be present therein. Accordingly, voltage comparator 36 receives at its non-inverting input a reference voltage V-7 corresponding to the minimum value of tuning voltage for channel 7 and receives at its inverting input the actual tuning voltage VT. Band signal VB-H is HIGH when tuning in the upper VHF band. When VT is less than V-7, the HIGH output signal from comparator 36 produces coincidence at AND gate 37. This enables AND gate 39 through which 8 kilohertz clock signal CLK-1-C then passes. OR gate 34 and AND gate 35 pass CLK-1-C to serve as signal CLK-2, thereby increasing the rate at which binary word BW is increased or decreased by a factor of 4. During this time, the HIGH level from AND gate 37 is inverted by inverter 38, thereby to inhibit AND gates 32 and 33 from passing either of clock signals CLK-1-A and CLK-1-B. When VT exceeds V-7, coincidence is removed at AND gate 37 and signal CLK-2 reverts to the CLK-1-A frequency and normal VHF band scanning rate obtains. It is again noted that signal CLK-2 is developed by AND gate 35 only at times when scanning is occurring and AFT is not valid, as described above.

Figure 7:
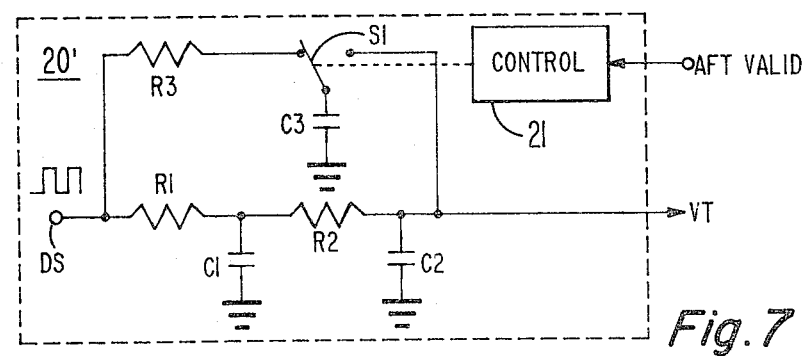

Modifications to the above-described embodiments are contemplated to be within the scope of the present invention which should be limited only by the claims following. FIG. 7, for example, shows a modification in which low-pass filter portion 20' of digital-to-analog converter 22 filters digital pulse signals applied at terminal DS to develop analog tuning voltage VT. Low-pass filtering is provided by resistors R1 and R2 and capacitors C1 and C2, the values of which determine the time constant of the filter. Each of C1 and C2 becomes charged to the average value of the digital waveform at terminal DS, which average value is VT. Similarly, with switch S1 in the position shown during scanning, the low-pass filter formed by resistor R3 and capacitor C3 also becomes charged to that average voltage. When signal AFT VALID is applied to stop scanning, it is applied to control 21 to switch S1 thereby placing capacitors C2 and C3 in parallel, substantially increasing the time constant of filter 20'. As a result, the filter time constant is kept to the minimum value consistent with rapid channel scanning and is increased to a substantially higher value when scanning has terminated consistent with the filtering required to obtain stability of tuning voltage VT.

In addition, it could be desirable to provide means for reversing the scan direction without waiting for acquisition of a valid TV signal. Such scan reversing can be provided by further coupling scan control S-UP to reset R of FF1 and by coupling S-DN to reset R of FF2. Moreover, switches S-UP and S-DN can be respectively coupled to FF1 and FF2 through debouncing circuits.

Other circuits can be employed in place of ring counter 46 for developing band signals VB. For example, a binary counter or a plurality of flip-flops with appropriate encoding of their respective output signals is also satisfactory.

What is claimed is:

1. A signal-seeking tuning system for scanning at least one radio frequency (RF) signal band which includes a plurality of channels in which RF signals may be present, for selecting present ones of said RF signals, which tuning system comprises:

tuning means, responsive to a tuning signal for selecting and heterodyning a present one of said RF signals to produce an IF signal having a nominal frequency;

signal processing means receiving said IF signals, and including means for applying a control signal to said tuning means to fine tune said IF signal to said nominal frequency;

a source of clock signals;

means for selectively developing an up signal and a down signal;

digital counter means for generating a binary word having minimum and maximum values, said binary word increasing in value in response to said clock signal and said up signal being applied to said counter means, and decreasing in value in response to said clock signal and said down signal being applied thereto, said binary word changing cyclically between said minimum and said maximum values;

converting means coupled to said counter means for developing said tuning signal responsive to said binary word;

detecting means responsive to said signal processing means and coupled to said counter means for stopping said counter means from changing the value of said binary word when said IF signal has a predetermined IF signal condition;

correction means coupled between said detecting means and said counter means for thereafter decrementing the value of said binary word when said control signal departs from a predetermined control signal condition by a first predetermined amount in a first direction and for incrementing the value of said binary word when said control signal departs from said predetermined control signal condition by a second predetermined amount in a second direction opposite to the first direction, said first and second directions being such that the tuning signal is adjusted for tuning said IF signal to said nominal frequency; and inhibiting means to which said detecting means is coupled for inhibiting said correction means from incrementing or decrementing said binary word whenever said selected present RF signal is lost at a time subsequent to said predetermined IF signal condition having been detected by said detecting means.

2. The tuning system of claim 1 wherein said detecting means comprises:

comparison means for developing first and second comparison signals when said control signal exceeds a predetermined range of values in first and second direction senses, respectively; and stopping means responsive to one of said first and second comparison signals being developed, and to the other of said first and second comparison signals thereafter being developed, for removing said clock signal from said counter means.

3. The tuning system of claim 1 or 2 wherein said control signal has a magnitude responsive to the departure of said IF signal from said nominal frequency.

4. The tuning system of claim 2 wherein said detecting means further includes means for developing a third signal indicating presence of a second predetermined condition of said IF signal.

5. The tuning system of claim 4 wherein said predetermined condition of said IF signal includes presence of a television synchronization signal.

6. The tuning system of claim 4 wherein said inhibiting means comprises:

bistable means, having first and second stable states, respectively for further inhibiting and not inhibiting said correction means incrementing and decrementing said binary word, said bistable means being responsive to said stopping means for changing to said second stable state; and means responsive to said third signal for putting said bistable means in said first stable state at times when said third signal is removed subsequent to its having been previously applied.

7. The tuning system of claim 2 wherein said correction means includes:

means for applying an incrementing pulse signal to said counter means to increment said binary word, which incrementing pulse signal is developed responsive to said first comparison signal; and means for applying a decrementing pulse signal to said counter means to decrement said binary word, which decrementing pulse signal is developed responsive to said second comparison signal.

8. The tuning system of claim 7 wherein said correction means further includes timing means for preventing said decrementing pulse signal from being applied within a predetermined time interval subsequent to a previously applied decrementing pulse signal, and for preventing said incrementing pulse signal from being applied within said predetermined time interval subsequent to a previously applied incrementing pulse signal.

9. The tuning system of claim 2 wherein said correction means includes means responsive to said first and second comparison signals for respectively decrementing and incrementing said binary word subsequent to said removal of said clock signal from said counter means.

10. A signal-seeking tuning system for scanning at least one radio frequency (RF) signal band which includes a plurality of channels in which RF signals may be present, for selecting present ones of said RF signals, which tuning system comprises:

tuning means, responsive to a tuning signal for selecting and heterodyning a present one of said RF signals to produce an IF signal having a nominal frequency;

signal processing means receiving said IF signals, and including means for applying a control signal to said tuning means to fine tune said IF signal to said nominal frequency;

a source of clock signals;

means for selectively developing a scan signal;

digital counter means for generating a binary word having minimum and maximum values, said binary word changing in value in a predetermined sense in response to said clock signal and said scan signal being applied to said counter means, said binary word changing cyclically between said minimum and said maximum values;

converting means coupled to said counter means for developing said tuning signal responsive to said binary word;

detecting means responsive to said signal processing means and coupled to said counter means for stopping said counter means from changing the value of said binary word when said IF signal has a predetermined condition;

correction means coupled between said detecting means and said counter means for thereafter decrementing the value of said binary word when said control signal exceeds a predetermined range of values in a first direction and for incrementing the value of said binary word when said control signal exceeds said range in an opposite direction, said first and opposite directions being such that the tuning signal is adjusted for tuning said IF signal to said nominal frequency; and inhibiting means to which said detecting means is coupled for inhibiting said correction means from changing said binary word whenever said selected present RF signal is lost at a time subsequent to said predetermined condition having been detected by said detecting means.

* * * * *

UNITED STATES PATENT AND TRADEMARK OFFICE
CERTIFICATE OF CORRECTION

PATENT NO. : 4,429,415
DATED : January 31, 1984
INVENTOR(S) : Danny Chin, John G. N. Henderson and Robert J. Maturo It is certified that error appears in the above-identified patent and that said Letters Patent is hereby corrected as shown below:

Column 9, Claim 5, line 1, after "said" insert --second--.
Column 9, Claim 6, line 4, "respectively for" should be --for respectively-- and "further" should be deleted.

Signed and Sealed this

Fifth Day of February 1985

[SEAL]

Attest:

DONALD J. QUIGG

Attesting Officer    Acting Commissioner of Patents and Trademarks